United States Patent

Inui

[11] Patent Number: 6,060,910
[45] Date of Patent: May 9, 2000

[54] DYNAMIC LOGIC CIRCUIT

[75] Inventor: Shigeto Inui, Tokyo, Japan

[73] Assignee: NEC Corporation, Tokyo, Japan

[21] Appl. No.: 09/131,364

[22] Filed: Aug. 7, 1998

[30] Foreign Application Priority Data

Aug. 8, 1997 [JP] Japan ................................ 9-227496

[51] Int. Cl.$^7$ .......................... H03K 19/01; H03K 19/00; H03K 19/096; H03K 19/094
[52] U.S. Cl. ............................ 326/98; 326/98; 326/93; 326/17; 326/112; 326/119; 326/121
[58] Field of Search .................. 326/98, 93, 17, 326/95, 112, 119, 121

[56] References Cited

U.S. PATENT DOCUMENTS

| | | | |
|---|---|---|---|
| 5,525,916 | 6/1996 | Gu et al. ................................ | 326/98 |
| 5,572,151 | 11/1996 | Hanawa et al ........................ | 326/113 |
| 5,677,641 | 10/1997 | Nishio et al. ......................... | 326/121 |
| 5,933,038 | 8/1999 | Klass .................................... | 327/208 |

OTHER PUBLICATIONS

Neil H.E. Weste et al., "Principles of CMOS VLSI Design", Maruzen K.K., pp. 142–144.

*Primary Examiner*—Michael Tokar
*Assistant Examiner*—Vibol Tan
*Attorney, Agent, or Firm*—Young & Thompson

[57] ABSTRACT

A high-speed dynamic logic circuit having a high tolerance to noise includes pMOS and nMOS transistors constructing a buffer, which is connected to an internal dynamic node, for driving an output terminal. Only the pMOS transistor, which operates in an evaluation cycle, is connected to the dynamic node. The nMOS transistor is driven by a signal that is the inverse of a precharge signal. A weak latch, or an nMOS transistor of minimum size driven by the dynamic node, is connected to the output terminal as a leakage compensation circuit.

10 Claims, 4 Drawing Sheets

PRIOR ART

DYNAMIC LOGIC CIRCUIT

FIELD OF THE INVENTION

This invention relates to a dynamic logic circuit, which is one of the basic elements that constitute a large scale integrated circuit. More particularly, the invention relates to a dynamic logic circuit ideal for operation at higher speeds when used in a large scale integrated circuit.

BACKGROUND OF THE INVENTION

FIG. 3 illustrates an example of a domino logic circuit, which is one example of a dynamic logic circuit. A domino logic circuit of this kind is described in the publication "Principles of CMOS VLSI Design", by Neil H. E. Weste and Kamran Eshraghian, inspected/translated by Takashi Tomizawa and Yasuo Matsuyama, Maruzen K. K. , pp. 142–144, by way of example.

The domino logic circuit of FIG. 3 has a logical evaluation unit 90 which includes a logic network 92 composed of a plurality of nMOS transistors in serial/parallel connection. A pMOS transistor P92 for precharging is disposed between the logic network 92 and a power supply terminal and a precharge signal PCH is applied to the pMOS transistor P92 as a gate input. The point at which the logic network 92 and precharge pMOS transistor P92 are connected serves as a precharge node PC90. An nMOS transistor N94 for permitting evaluation is disposed between the logic network 92 and a ground terminal, and the precharge signal PCH is applied to the nMOS transistor P94 as a gate input. A leakage compensation circuit 93 comprising an inverter INV1 and a pMOS transistor P91 is connected to the precharge node PC90.

A pMOS transistor P90 making up an output buffer 91 is disposed between an output terminal OUT0 and a power supply terminal, an nMOS transistor N90 making up this output buffer 91 is disposed between the output terminal OUT0 and a ground terminal, and the precharge node PC90 is connected to the gate inputs of these transistors.

In the following, specific analysis is given by the present inventors for illustrating the problems encountered in the prior art.

In the operation of the domino logic circuit shown in FIG. 3, assume first that the precharge signal PCH is at the low level. In this case the domino logic circuit operates in a precharge cycle. During the precharge cycle, the pMOS transistor P92 for precharging is conductive and the precharge node PC90 is charged. On the other hand, the nMOS transistor N94 for permitting evaluation is rendered non-conductive and the connection between the precharge node PC90 and the ground terminal is severed regardless of the states of input terminals IN0, . . . INx of the logic network 92.

Since the precharge node PC90 is charged and assumes the high level, the pMOS and nMOS transistors P90, N90 of the buffer 91 are rendered non-conductive and conductive, respectively. The output terminal, therefore, discharges.

If the precharge signal PCH is at the high level, the domino logic circuit operates in an evaluation cycle. During the evaluation cycle, the precharge pMOS transistor P92 is non-conductive and the evaluation n-MOS transistor N94 is conductive. The precharge node PC90 is discharged via the evaluation-permitting nMOS transistor N94 only if the result of evaluating the logic by the logic network 92 is true. Furthermore, the input to the pMOS transistor P90 of the buffer also is discharged and reverts to the low level, the pMOS transistor P90 and the nMOS transistor N90 of the buffer are rendered conductive and nonconductive, respectively, and the potential at the output terminal rises to the high level.

If the result of evaluation by the logic network 92 is false, the precharge node PC90 is not discharged and no change in the potential of the output terminal occurs. In this case the input potential of the buffer transistors P90 and N90 is fixed at the high level by the electric charge that has been accumulated in the precharge node PC90.

In an ordinary static logic circuit, the output potential of the circuit is decided by the power supply potential delivered via a transistor that has been rendered conductive. Even if noise occurs, therefore, the output potential always recovers to the power supply potential.

By contrast, if the result of evaluation by the logic network in a dynamic logic circuit such as the domino logic circuit is false, the result is a floating state in which the dynamic node is not connected to either the power supply or ground. This causes a major decline in tolerance to noise.

In order to compensate for this problem, the general practice is to add on a leakage compensation circuit which compensates for leakage caused by noise.

In the domino logic circuit shown in FIG. 3, the leakage compensation circuit 93 is added onto the dynamic node PC90. The leakage compensation circuit 93 drives the leakage pMOS transistor P91 by the inverter INV1, the input to which is the dynamic node PC90, thereby compensating for noise-induced leakage.

Of the MOS transistors constructing the inverter (buffer) 91 of the output stage in the prior-art domino logic circuit described above, the transistor that operates in the evaluation cycle is solely the pMOS transistor that discharges the output terminal. The nMOS transistor appears only as a load during the evaluation cycle. This is the cause of a delay.

A technique for speeding up a dynamic logic circuit is disclosed for example in the specification of Japanese Patent Application Laid-Open (KOKAI) No. 8-84066 entitled "Dynamic Logic Circuit". Specifically, this application proposes a dynamic-type logic circuit in which a single logic module is constructed by directly connecting the output terminals of a plurality of dynamic logic gates, which comprise a logical operation network constructed by combining a plurality of semiconductor switches, a precharge semiconductor switch connected between the logical operation network and a power supply terminal and a discharging semiconductor switch connected between the logical operation network and a ground terminal, to the input terminals of a static logic gate comprising a logical operation network constructed by combining a plurality of complementary semiconductor switches. FIG. 4 illustrates an example of the dynamic logic circuit proposed by the aforesaid Japanese Patent Application Laid-Open No. 8-84066.

As shown in FIG. 4, the logic circuit is composed primarily of three sections. NOR gates 81 and 82 construct OR logic using ordinary domino logic circuits. Inverter sections added onto the outputs from these domino logic circuits are deleted. Accordingly, the internal dynamic nodes are connected directly to respective output terminals PC81 and PC82. The output terminals PC81 and PC82 of the two dynamic logic circuits NOR 81 and NOR 82 are connected to the inputs of a NOR gate 83. The NOR gate 83 is an ordinary CMOS static logic circuit. In addition to implementing a NOR function, the NOR gate 83 acts as the buffer of the outputs from the two dynamic logic circuits NOR 81, and NOR 82.

The operation of the prior-art dynamic logic circuit shown in FIG. 4 will now be described.

The basic operation of the two dynamic logic circuits NOR 81 and NOR 82 is substantially the same as that of the domino logic circuit described above with reference to FIG. 3. In the precharge cycle, the precharge transistors are rendered conductive and the respective precharge nodes are charged. On the other hand, the transistors for permitting evaluation (i.e., the discharging transistors) are rendered non-conductive to prohibit the discharge of the precharge nodes.

In the evaluation cycle, the precharge transistors become non-conductive and the evaluation-permitting transistors become conductive. The logic is evaluated by the logic networks constructed by nMOS transistors (namely by the NOR logic constructed by two parallel-connected nMOS transistors MN1, MN2 or by two parallel-connected nMOS transistors MN4, MN5). If the logic is true, the precharge nodes PC81, PC82 are discharged. If the logic is false, the precharge nodes PC81, PC82 are held in the floating state. In order to compensate for deteriorated tolerance to noise when the floating state prevails, a leakage compensation circuit comprising an inverter INV1 and a pMOS transistor MP2 is added onto the precharge node PC81, and a leakage compensation circuit comprising an inverter INV2 and a pMOS transistor MP4 is added onto the precharge node PC82.

The precharge nodes PC81, PC82 of the respective NOR gates 81, 82 are connected to the inputs of the static logic circuit NOR 83. The latter is an ordinary CMOS logic circuit, which evaluates logic based upon its inputs and generates an output potential. What generates the input signals are the dynamic logic circuits. This assures that the transition from the high to low level will occur only once in the evaluation cycle. In the static logic circuit NOR 83 disposed as the succeeding stage, therefore, only pull-down nMOS transistors MN7, MN8, the respective gate inputs of which are the precharge nodes PC81, PC82, operate to perform discharge at the output terminal when the precharge cycle prevails. Only pull-up pMOS transistors MP5, MP6 operate to perform charging at the output terminal when the evaluation cycle is in effect.

In the precharge cycle, generally there is some margin in terms of delay since it will suffice if the discharging of the output terminal and the charging of the precharge nodes is carried out in this cycle. In view of this property, it is recommended that the sizes of the nMOS transistors on the pull-down side in the dynamic logic circuit of FIG. 4 be made smaller than the sizes of the pMOS transistors on the pull-up side.

By adopting the circuit arrangement in which the dynamic logic circuits are placed in the preceding stage and the static logic circuit is placed in the preceding stage, it is possible to shorten the signal delay ascribable to the inverter added onto the output, this being the problem peculiar to the domino logic circuit, a high-speed circuit can be realized as a result. Eliminating the inverter is effective also is reducing the area of the device. Furthermore, with the domino logic circuit, all logic is constructed of dynamic logic circuits, meaning that power consumption is large. With the logic circuit shown in FIG. 4, however, using the static logic circuit in part of the device reduces the power consumed.

In a case where OR logic is employed as the static logic circuit as the succeeding stage of this conventional dynamic logic circuit, however, the fact that the pMOS transistors are serially connected means that the load capacitance driving capability is inferior in comparison with the case where the inverter is used as the succeeding stage of the simple domino logic circuit.

In case of the above-mentioned logic circuit which obtains an output signal by driving the inverter of the succeeding stage by the nMOS logic network of the preceding stage, a problem which arises is an increase in the delay time of the entire circuit owing to the signal delay in the inverter, as set forth above.

The reason for this problem is as follows: Of the nMOS transistor and pMOS transistor constructing the inverter of the succeeding stage, the transistor that operates in the evaluation cycle is solely the pMOS transistor; the nMOS transistor is driven by the nMOS logic network, the driving capability of which is exceedingly poor. The result is an increase in delay time.

In a case where OR logic is employed as the static logic circuit as the succeeding stage in the conventional dynamic logic circuit described above in connection with FIG. 4, the fact that the pMOS transistors are serially connected means that the load capacitance driving capability is inferior to the case where the inverter is used as the succeeding stage of the simple domino logic circuit.

SUMMARY OF THE DISCLOSURE

Accordingly, an object of the present invention is to provide a high-speed dynamic logic circuit having a high tolerance to noise.

According to the present invention, the foregoing object is attained by providing a dynamic logic circuit comprising: logic generating means (module) which includes a logic network constructed by a plurality of transistors, a precharge transistor connected between the logic network and a power supply terminal and having a precharge signal input thereto for performing a precharge operation, and a control transistor connected between the logic network and a ground terminal and having the precharge signal input thereto for controlling operation of the logic network; a transistor connected between the power supply terminal and an output terminal for charging the output terminal based upon result of evaluation by the logic generating means; and a transistor connected between the ground terminal and the output terminal and having a signal that is the inverse of the precharge signal input thereto for discharging the output terminal.

The dynamic logic circuit further includes an inverter having the output terminal connected to its input, and a transistor connected between the output terminal of the dynamic logic circuit and the ground terminal and having the output of the inverter input thereto for discharging the output terminal.

The dynamic logic circuit further includes a transistor connected between the output terminal and the ground terminal and having the result of evaluation by the logic generating means input thereto for discharging the output terminal.

Other features and advantages of the present invention will be apparent from the entire disclosure containing claims and the following description taken in conjunction with the accompanying drawings, in which like reference characters designate the same or similar parts throughout the figures thereof.

DESCRIPTION OF THE PREFERRED EMBODIMENTS

Figure 1:
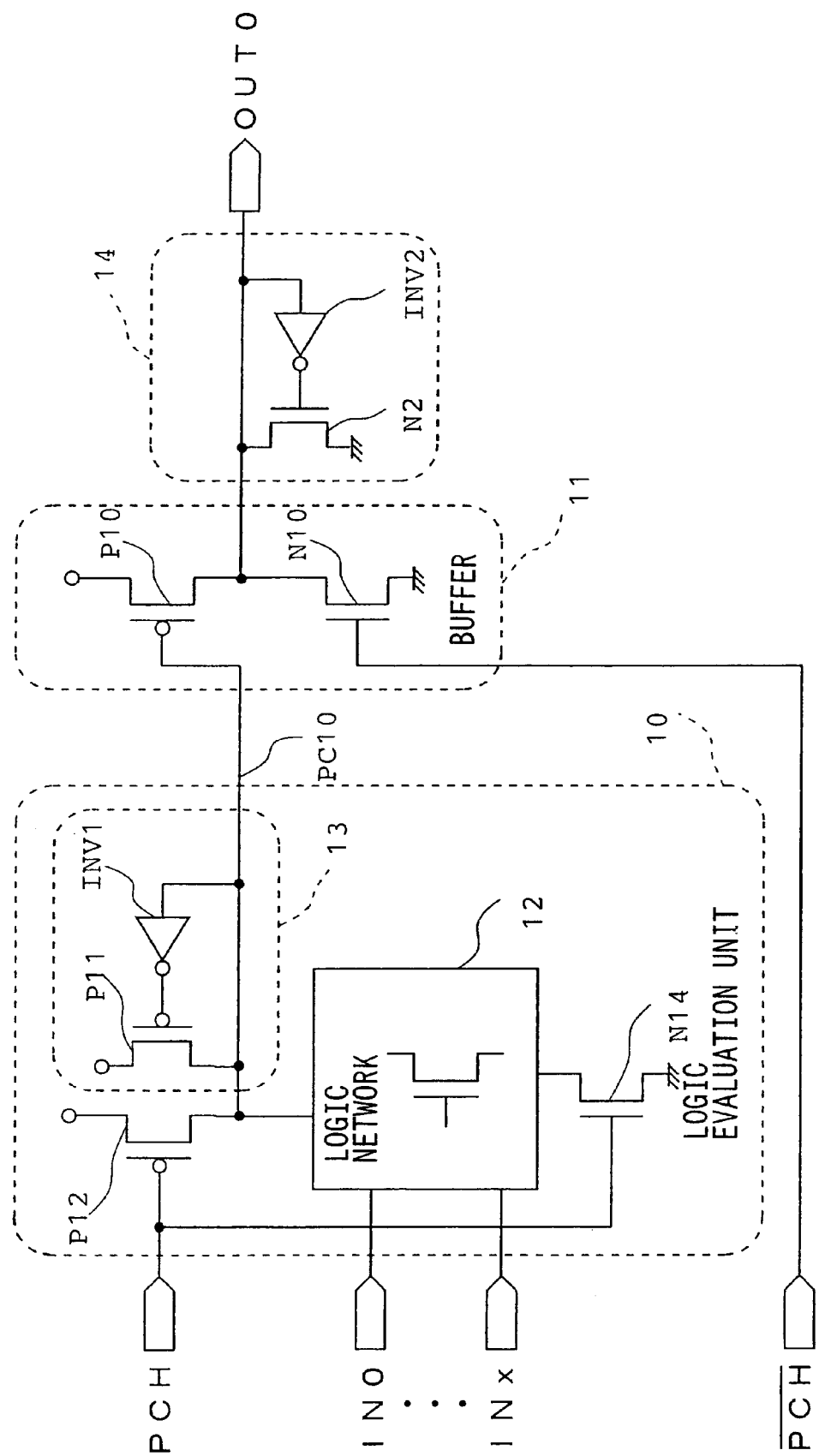
FIG. 1 is a diagram showing the construction of a first embodiment of a dynamic logic circuit according to the present invention.

A mode for practicing the present invention will be described below.

In a preferred embodiment of the invention, a dynamic logic circuit comprises: a logic generating unit (10 in FIG. 1) which includes a logic network (12 in FIG. 1) constructed by a plurality of transistors, a precharge transistor (P12 in FIG. 1) connected between the logic network and a power supply terminal and having a precharge signal input thereto for performing a precharging operation, and a control transistor (N14 in FIG. 1) connected between the logic network and a ground terminal and having the precharge signal input thereto for controlling operation of the logic network; a transistor (P10 in FIG. 1) connected between a power supply terminal and an output terminal (OUT0 in FIG. 1) for charging the output terminal based upon result (PC10 in FIG. 1) of evaluation by the logic generating unit (10 in FIG. 1); and a transistor (N10 in FIG. 1) connected between a ground terminal and the output terminal and having a signal that is the inverse of the precharge signal input thereto for discharging the output terminal.

Thus, in this mode of practicing the invention, only the pMOS transistor (P10 in FIG. 1), which operates in the evaluation cycle, of the MOS transistors constructing an output terminal driving buffer (11 in FIG. 1) connected to the internal dynamic node (PC10 in FIG. 1) is connected to the dynamic mode (PC 10 in FIG. 1), and the other nMOS transistor(N10 in FIG. 1) of the buffer 11 is driven by the signal that is the inverse of the precharge signal.

Furthermore, a weak latch (14 in FIG. 1) or an nMOS transistor (N12 in FIG. 2) of minimum size driven by the dynamic node is connected to the output terminal as a leakage compensating circuit.

In the preferred embodiments, the dynamic logic circuit of the invention is such that the logic network for evaluating logic does not drive an inverter constituting a buffer, as is the practice in the prior-art domino logic circuit, but drives only a pMOS transistor. The ratio of the sizes of the pMOS transistor to the nMOS transistor becomes about 2:1 on account of the difference between their load driving capabilities. Accordingly, with the embodiments of the invention, which do not require the driving of the nMOS transistor, it is possible to realize a 30% reduction in the input capacitance of an ordinary CMOS inverter. The result is higher speed.

Preferred embodiments of the present invention will now be described in detail with reference to the drawings.

FIG. 1 is a diagram showing the construction of a first embodiment of a dynamic logic circuit according to the present invention.

Figure 3:
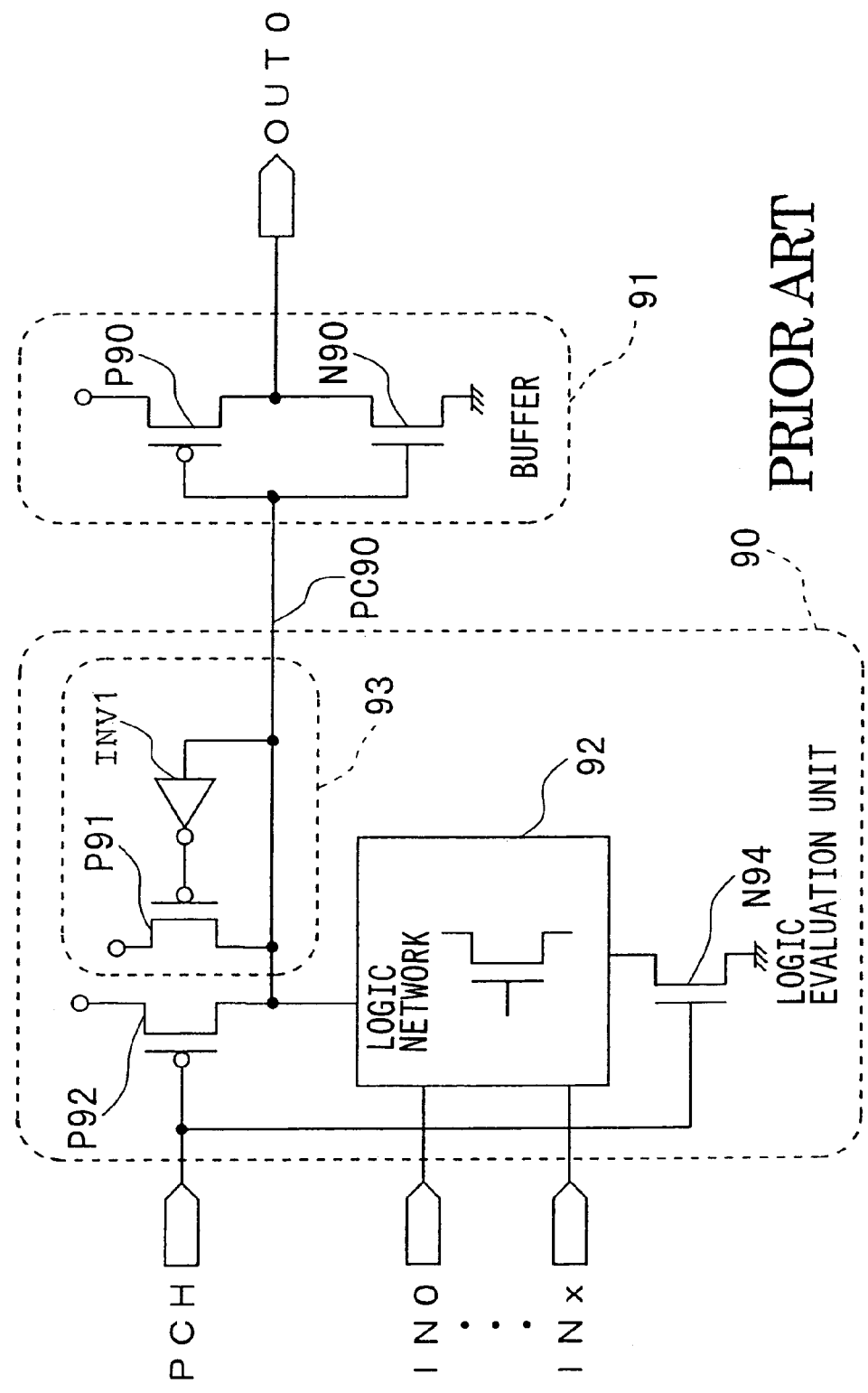
FIG. 3 is a diagram showing the construction of a domino logic circuit according to the prior art.
Figure 4:
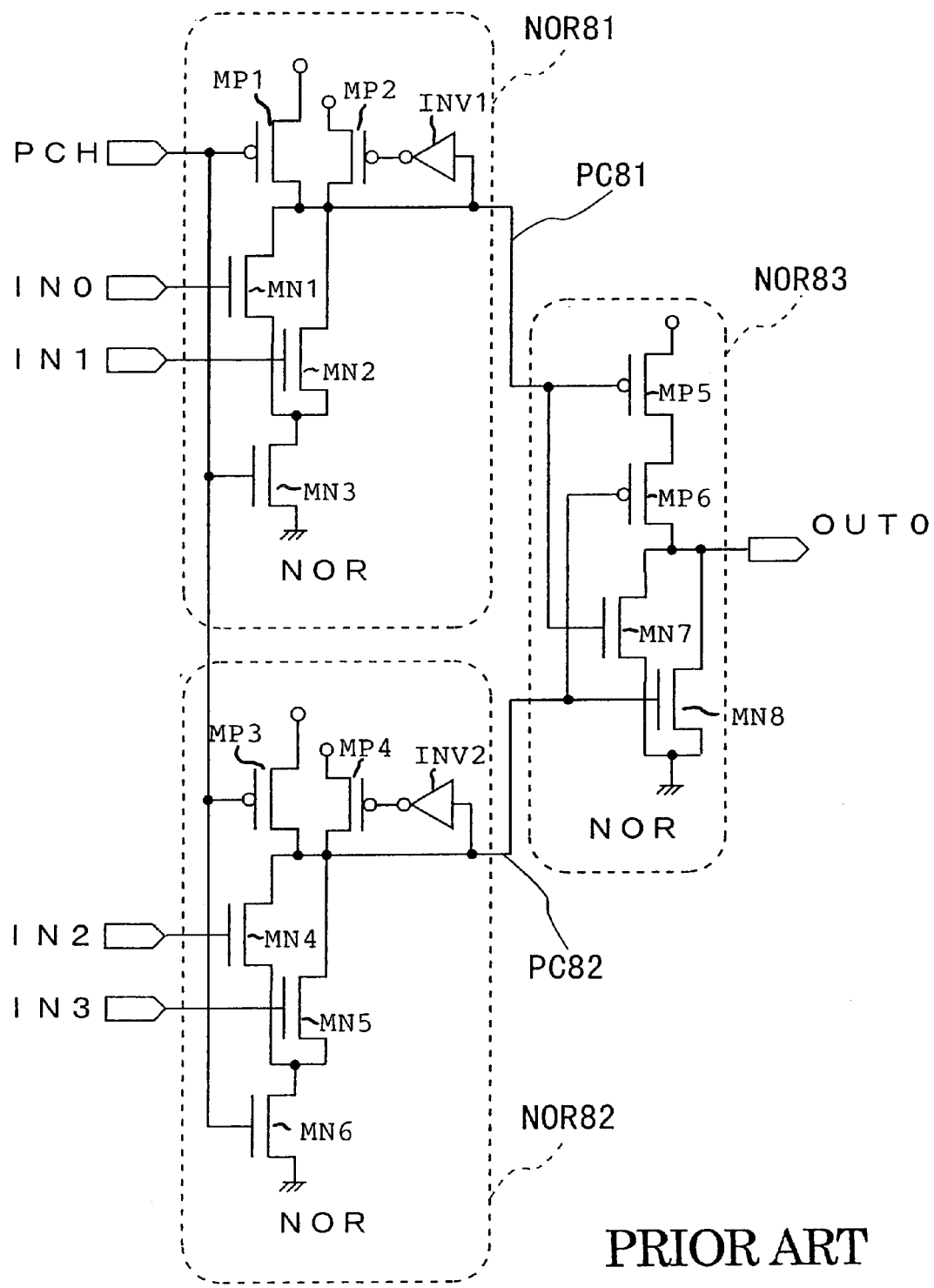
FIG. 4 is a diagram showing an example of a high-speed dynamic logic circuit according to the prior art.

As shown in FIG. 1, a logic evaluation unit 10, which includes a logic network 12, a precharge pMOS transistor P12, an evaluation nMOS transistor N14 and a leakage compensation circuit 13, has a construction the same as that of the logic evaluation unit 90 of the domino logic circuit shown in FIG. 3. That is, the logic network 12 is composed of a plurality of nMOS transistors. The pMOS transistor P12 for precharging is disposed between the logic network 12 and the power supply terminal and the precharge signal PCH is applied to the pMOS transistor P12 as a gate input. The point at which the logic network 12 and precharge pMOS transistor P12 are connected serves as a precharge node PC10. The nMOS transistor N14 for permitting evaluation is disposed between the logic network 12 and the ground terminal and the precharge signal PCH is applied to the nMOS transistor P14 as a gate input. The leakage compensation circuit 13 comprising the inverter INV1 and a pMOS transistor P11 is connected to the precharge node PC10.

A pMOS transistor P10 constructing an output buffer 11 is disposed between the output terminal OUT0 and the power supply terminal, and the precharge node 10 is connected to the gate input of the pMOS transistor P10. An nMOS transistor N10 for discharging the output terminal is disposed between the output terminal OUT0 and the ground terminal and has a signal PCH—, which is the inverse of the precharge signal, connected to its gate input. Further, the leakage compensation circuit 14 comprising an inverter INV2 and an nMOS transistor N2 is connected to the output terminal.

The operation of this embodiment will now be described.

First, assume that the precharge signal PCH is at the low level. In this case the circuit operates in the precharge cycle. During the precharge cycle, the pMOS transistor P12 for precharging is conductive and the precharge node PC10 is charged. On the other hand, the evaluation nMOS transistor N14 is rendered non-conductive and the connection between the precharge node PC10 and the ground terminal is severed regardless of the states of input terminals IN0, . . . INx connected to the input side of the logic network 12. Since the precharge node PC10 assumes the high level, the pMOS and nMOS transistors P10, N10 constituting the buffer 1 are rendered non-conductive and conductive, respectively. The output terminal, therefore, discharges.

If the precharge signal PCH is at the high level, the circuit operates in the evaluation cycle. During the evaluation cycle, the pMOS transistor P12 for precharging and the n-MOS transistor N10 for discharging the output terminal are non-conductive and the evaluation nMOS transistor N14 is conductive.

The precharge node PC10 connected to the logic network 12 is discharged via the evaluation nMOS transistor N14 only in a case where the result of evaluation is true based upon the result of logic evaluation by the logic network 12. Further, the input of the buffer pMOS transistor P10 also is discharged and assumes the low level, the pMOS transistor P10 is rendered conductive and the potential of the output terminal attains the high level.

In the case of the domino logic circuit according to the prior art, it is necessary at this time that the precharge node PC10 drive not only the pMOS transistor of the buffer but also the nMOS transistor. In general, the domino logic circuit is such that more logic is constructed by a single gate stage in comparison with a complementary static CMOS logic circuit. Accordingly, through the logic network 12 comprising nMOS transistors includes many serial chains of nMOS transistors, the larger the number of stages arranged in series, the greater the decline in driving capability and the longer the delay time.

By contrast, the dynamic logic circuit according to this embodiment of the invention is such that the nMOS transistor N10 for discharging the output terminal is driven by the signal that is the inverse of the precharge signal PCH. As a result, the capacity of the precharge node is PC10 is reduced and the speed of the device is increased.

It should be noted that in a case where the result of evaluation by logic network 12 is false and the precharge node PC10 has not discharged, the buffer pMOS transistor P10 for driving the output terminal OUT0 and the discharge nMOS transistor N10 are both non-conductive. Consequently, the output terminal floats, tolerance to noise declines and erroneous discharge due to leakage current can occur.

In this embodiment, therefore, in order to compensate for the reduced tolerance to noise, the leakage compensation circuit (latch circuit) 14 is added on to the other circuitry, the leakage compensation circuit 14 comprising the nMOS transistor N2, which is connected between the output terminal (the output of the buffer 11) and the ground terminal, and the inverter INV2, whose input terminal is connected to the output terminal (the output of the buffer 11) and whose output terminal is connected to the gate of the nMOS transistor N2, as illustrated in FIG. 1.

A second embodiment of the present invention will now be described.

Figure 2:
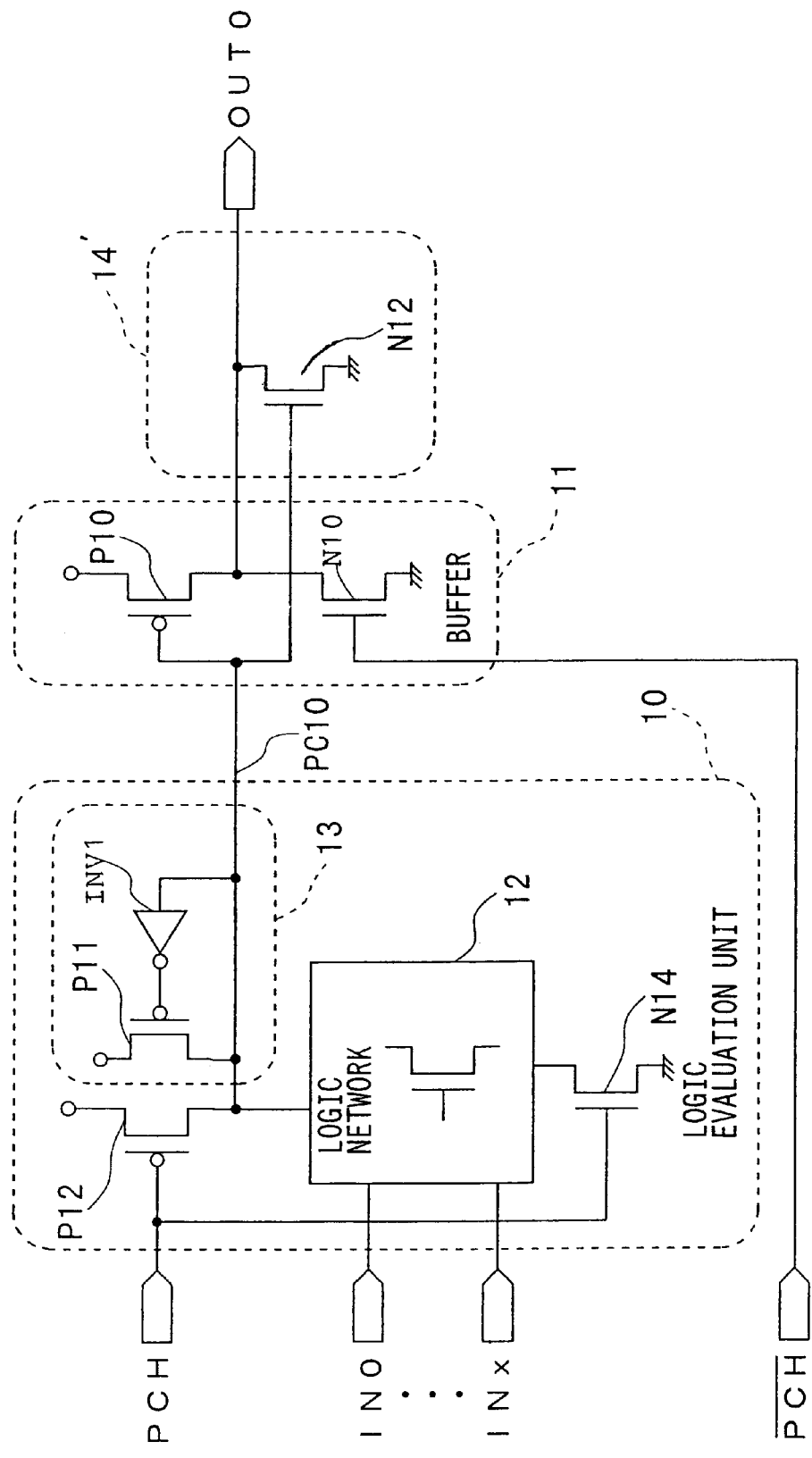
FIG. 2 is a diagram showing the construction of a second embodiment of a dynamic logic circuit according to the present invention.

FIG. 2 is a diagram illustrating the construction of the second embodiment. Components identical with or similar to those of the first embodiment are designated by like reference characters.

The second embodiment of the invention differs from the first embodiment in the construction of the leakage compensation circuit (here indicated at 14') which compensates for leakage from the output terminal OUT0 in a case where the result of evaluation by the logic network 12 is false and the precharge node P10 has not discharged. In the first embodiment described above, the leakage compensation circuit 14 is realized using a weak latch that employs the nMOS transistor N2, which has a low driving power.

In the second embodiment, the leakage compensation circuit 14' of the output terminal is constituted by a discharge nMOS transistor N12 connected between the output terminal (the output of the buffer 11) and ground and having the precharge node P10 connected to its gate as an input.

The discharging of the output terminal at the beginning of the precharge cycle is carried out by the discharge nMOS transistor N10, whose ON/OFF operation is controlled by the signal PCH— that is the inverse of the precharge signal. As a result, the discharge nMOS transistor N12 need only compensate for leakage due to noise. This means that the width of this transistor can be minimized.

If the nMOS transistor (N90 in FIG. 3) of the inverter in the output stage is made too small in the case of the conventional dynamic logic circuit, complete discharge of the output terminal cannot be performed in the precharge cycle and the possibility of erroneous operation arises.

The minimum size is decided by the size of the source/drain contacts of the transistor in a case where use is made of process techniques available at the present time. More specifically, the size of the discharge nMOS transistor N12 is that which allows at most one to be disposed in the source/drain regions. By thus using an nMOS transistor of this minimum size, it is possible to minimize the increase in delay when the precharge node PC10 is discharged by the logic network 12.

The difference between the first and second embodiments resides in the method of controlling the nMOS transistor for leakage compensation. In the first embodiment, the latch structure is adopted. In the second embodiment, drive is performed by the precharge node.

In comparison with the second embodiment, the load capacitance added onto the precharge node in the first embodiment is smaller by an amount equivalent to the input capacitance of the nMOS transistor for leakage compensation. Consequently, the discharge of the precharge node by the logic network 12 can be performed at higher speed. However, since the leakage compensation circuit 14 added onto the output terminal has the latch structure in accordance with the first embodiment, erroneous operation is conceivable if noise greater than the logical threshold value of the inverter INV2 constituting the latch occurs at the output terminal.

In accordance with the second embodiment, on the other hand, there is a high tolerance to noise because the leakage compensation circuit 14' has the static structure.

In view of the foregoing, therefore, an integrated circuit having a high speed and high tolerance to noise can be constructed by using the first embodiment at portions where higher speed is sought more than tolerance to noise and using the second embodiment at portions where tolerance to noise is more important.

One effect of the present invention is that a high-speed dynamic logic circuit can be constructed. The reason for this is that, according to the invention, the buffer transistor driven by the logic network is only the pull-up pMOS transistor, it being unnecessary to drive the nMOS transistor.

Another effect of the present invention is that it is possible to realize a dynamic logic circuit having a tolerance to noise the same as that of the conventional domino logic circuit while being capable of high-speed operation at the same time. The reason for this is that, according to the invention, leakage compensation is made possible by a latch of weak driving power or by an nMOS transistor of small size driven by the dynamic node in a case where the output terminal is in the floating state.

As many apparently widely different embodiments of the present invention can be made without departing from the spirit and scope thereof, it is to be understood that the invention is not limited to the specific embodiments thereof except as defined in the appended claims.

What is claimed is:

1. A dynamic logic circuit comprising:
    logic generating module which includes:
        a logic network constructed by a plurality of transistors;
        a precharge transistor connected between said logic network and a power supply terminal and having a precharge signal input thereto for performing a precharge operation; and
        a control transistor connected between said logic network and a ground terminal and having the precharge signal input thereto for controlling operation of said logic network;
    a transistor connected between the power supply terminal and an output terminal for charging the output terminal based upon result of evaluation by said logic generating module; and
    a transistor connected between the ground terminal and the output terminal and having a signal that is the inverse of the precharge signal input thereto for discharging the output terminal.

2. The logic circuit according to claim 1, further comprising a leakage compensation circuit which includes:
    an inverter having the output terminal connected to its input; and
    a transistor connected between an output terminal and the ground terminal and having an output of said inverter input thereto for discharging the output terminal.

3. The logic circuit according to claim 1, further comprising a transistor connected between the output terminal and the ground terminal and having the result of evaluation by said logic generating module input thereto for discharging the output terminal.

4. The logic circuit according to claim 1, wherein said transistors for charging and discharging the output terminal are pMOS transistor and an nMOS transistor, respectively.

5. The logic circuit according to claim 1, further comprising a leak compensating circuit connected to an output of said logic network.

6. A dynamic logic circuit comprising:

a logic network constructed by a plurality of transistors;

a first transistor connected between said logic network and a power supply terminal on a side of high potential and having a precharge signal input thereto for performing a precharge operation; and a second transistor connected between said logic network and a power supply terminal on a side of low potential and having the precharge signal input thereto for controlling operation of said logic network;

wherein an output buffer is provided for outputting, to an output terminal, the value of a node connected to the result of an evaluation by said logic network, said output buffer having a transistor, which is on a side of high potential, that operates in an evaluation cycle, and a transistor on a side of low potential, said transistor on the side of high potential having a gate terminal connected to said node, and said transistor on the side of low potential having a gate terminal connected to a signal that is the inverse of the precharge signal;

a latch circuit for latching the state of said output buffer, or a transistor driven by the node, being connected to the output terminal as a leakage compensation circuit.

7. The dynamic logic circuit according to claim 6, wherein said transistor of the output buffer on the side of high potential is a pMOS transistor, and said transistor of the output buffer on the side of low potential is an nMOS transistor.

8. The dynamic logic circuit according to claim 6, wherein said latch circuit comprises a transistor being connected between the output terminal and the ground terminal and having its gate connected to said node.

9. The dynamic logic circuit according to claim 8, wherein said latch circuit transistor is an nMOS transistor.

10. The dynamic logic circuit according to claim 5, further comprising a leak compensating circuit connected to an output of said logic network.

* * * * *